United States Patent
Gandhi et al.

(10) Patent No.: US 10,593,638 B2
(45) Date of Patent: Mar. 17, 2020

(54) METHODS OF INTERCONNECT FOR HIGH DENSITY 2.5D AND 3D INTEGRATION

(71) Applicant: Xilinx, Inc., San Jose, CA (US)

(72) Inventors: Jaspreet Singh Gandhi, San Jose, CA (US); Suresh Ramalingam, Fremont, CA (US); Henley Liu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/473,294

(22) Filed: Mar. 29, 2017

(65) Prior Publication Data

US 2018/0286826 A1    Oct. 4, 2018

(51) Int. Cl.
*H01L 23/00* (2006.01)
*H01L 25/065* (2006.01)
*H01L 23/498* (2006.01)

(52) U.S. Cl.
CPC ........ *H01L 24/13* (2013.01); *H01L 23/49816* (2013.01); *H01L 23/49827* (2013.01);
(Continued)

(58) Field of Classification Search
CPC . H01L 2224/05123; H01L 2224/13147; H01L 2225/1058; H01L 2224/0558–05584; H01L 2224/1308–13084; H01L 2224/05223; H01L 2224/05323; H01L 2224/05423; H01L 2224/05623; H01L 2224/05723; H01L 2224/05823; H01L 2224/05923; H01L 2224/13123; H01L 2224/13223; H01L 2224/13323; H01L 2224/13423; H01L 2224/13623; H01L 2224/13723; H01L 2224/13823; H01L 2224/13923; H01L 2224/29123; H01L 2224/29223;
(Continued)

(56) References Cited

U.S. PATENT DOCUMENTS

| | | | |
|---|---|---|---|
| 6,190,940 B1 * | 2/2001 | DeFelice | H01L 21/563 257/737 |
| 6,703,069 B1 * | 3/2004 | Moon | B23K 1/0016 257/737 |

(Continued)

OTHER PUBLICATIONS

Lau, Flip Chip Technologies, 1995,McGraw-Hill, pp. 27-28 (Year: 1995).*

*Primary Examiner* — David A Zarneke
(74) *Attorney, Agent, or Firm* — Patterson + Sheridan, LLP

(57) ABSTRACT

Methods and apparatus are described for enabling copper-to-copper (Cu—Cu) bonding at reduced temperatures (e.g., at most 200° C.) by significantly reducing Cu oxide formation. These techniques provide for faster cycle time and entail no extraordinary measures (e.g., forming gas). Such techniques may also enable longer queue (Q) or staging times. One example semiconductor structure generally includes a semiconductor layer, an adhesion layer disposed above the semiconductor layer, an anodic metal layer disposed above the adhesion layer, and a cathodic metal layer disposed above the anodic metal layer. An oxidation potential of the anodic metal layer may be greater than an oxidation potential of the cathodic metal layer. Such a semiconductor structure may be utilized in fabricating IC packages implementing 2.5D or 3D integration.

4 Claims, 5 Drawing Sheets

(52) U.S. Cl.
CPC ........ *H01L 23/49838* (2013.01); *H01L 24/05* (2013.01); *H01L 24/16* (2013.01); *H01L 25/0655* (2013.01); *H01L 25/0657* (2013.01); *H01L 24/03* (2013.01); *H01L 24/11* (2013.01); *H01L 24/81* (2013.01); *H01L 2224/0345* (2013.01); *H01L 2224/03614* (2013.01); *H01L 2224/03622* (2013.01); *H01L 2224/0401* (2013.01); *H01L 2224/05166* (2013.01); *H01L 2224/05171* (2013.01); *H01L 2224/05181* (2013.01); *H01L 2224/05618* (2013.01); *H01L 2224/05623* (2013.01); *H01L 2224/05624* (2013.01); *H01L 2224/05655* (2013.01); *H01L 2224/1162* (2013.01); *H01L 2224/11462* (2013.01); *H01L 2224/11614* (2013.01); *H01L 2224/13147* (2013.01); *H01L 2224/16145* (2013.01); *H01L 2224/16227* (2013.01); *H01L 2224/81895* (2013.01); *H01L 2225/06513* (2013.01); *H01L 2225/06517* (2013.01); *H01L 2225/06541* (2013.01)

(58) Field of Classification Search
CPC . H01L 2224/29323; H01L 2224/29423; H01L 2224/29623; H01L 2224/29723; H01L 2224/29823; H01L 2224/29923; H01L 2224/37123; H01L 2224/37223; H01L 2224/37323; H01L 2224/37423; H01L 2224/37623; H01L 2224/37723; H01L 2224/37823; H01L 2224/37923; H01L 2224/45123; H01L 2224/45223; H01L 2224/45323; H01L 2224/45423; H01L 2224/45623; H01L 2224/45723; H01L 2224/45823; H01L 2224/45923; H01L 2224/48623; H01L 2224/48723; H01L 2224/48823; H01L 2224/80423; H01L 2224/80523; H01L 2224/80623; H01L 2224/80723; H01L 2224/81423; H01L 2224/81523; H01L 2224/81623; H01L 2224/81723; H01L 2224/83423; H01L 2224/83523; H01L 2224/83623; H01L 2224/83723; H01L 2224/84423; H01L 2224/84523; H01L 2224/84623; H01L 2224/84723; H01L 2224/85423; H01L 2224/855203; H01L 2224/85623; H01L 2224/85723

See application file for complete search history.

(56) References Cited

U.S. PATENT DOCUMENTS

| | | | | |
|---|---|---|---|---|
| 7,402,509 | B2 * | 7/2008 | Kobrinsky | H01L 21/76852 257/737 |
| 8,598,030 | B2 * | 12/2013 | Kuo | H01L 24/11 438/614 |
| 8,993,431 | B2 * | 3/2015 | Hsu | H01L 24/11 438/613 |
| 9,646,945 | B2 * | 5/2017 | Kim | H01L 24/13 |
| 10,020,281 | B2 * | 7/2018 | Yang | H01L 24/80 |
| 10,128,206 | B2 * | 11/2018 | Lin | H01L 24/03 |
| 2004/0166661 | A1 * | 8/2004 | Lei | H01L 24/03 438/614 |
| 2005/0003650 | A1 * | 1/2005 | Ramanathan | H01L 24/11 438/614 |
| 2005/0048798 | A1 * | 3/2005 | Bojkov | C23F 1/18 438/784 |
| 2006/0237842 | A1 * | 10/2006 | Shindo | H01L 24/03 257/737 |
| 2010/0230811 | A1 * | 9/2010 | Shin | H01L 24/05 257/737 |
| 2011/0233761 | A1 * | 9/2011 | Hwang | H01L 24/03 257/737 |
| 2012/0040524 | A1 * | 2/2012 | Kuo | H01L 24/11 438/614 |
| 2012/0091577 | A1 * | 4/2012 | Hwang | H01L 24/11 257/737 |
| 2012/0178251 | A1 * | 7/2012 | Lim | H01L 24/11 438/613 |
| 2014/0167256 | A1 | 6/2014 | Tan | |
| 2014/0329382 | A1 | 11/2014 | Hwang et al. | |
| 2014/0346663 | A1 | 11/2014 | Chopin et al. | |
| 2016/0027751 | A1 * | 1/2016 | Kim | H01L 24/13 257/737 |
| 2016/0071824 | A1 * | 3/2016 | Yoon | H01L 25/50 257/738 |
| 2016/0240503 | A1 * | 8/2016 | Shu | H01L 23/3142 |
| 2017/0278814 | A1 * | 9/2017 | Hung | H01L 24/13 |
| 2018/0102302 | A1 * | 4/2018 | Grassmann | H01L 24/49 |
| 2018/0122781 | A1 * | 5/2018 | Chen | H01L 28/40 |

\* cited by examiner

METHODS OF INTERCONNECT FOR HIGH DENSITY 2.5D AND 3D INTEGRATION

TECHNICAL FIELD

Examples of the present disclosure generally relate to integrated circuits and, more particularly, to integrated circuit packaging using copper-to-copper (Cu—Cu) bonding.

BACKGROUND

Electronic devices (e.g., computers, laptops, tablets, copiers, digital cameras, smart phones, and the like) often employ integrated circuits (ICs, also known as "chips"). These integrated circuits are typically implemented as semiconductor dies packaged in integrated circuit packages. The semiconductor dies may include memory, logic, and/or any of various other suitable circuit types.

Many integrated circuits and other semiconductor devices utilize an arrangement of bumps, such as a ball grid array (BGA), for surface mounting packages to a circuit board (e.g., printed circuit board (PCB). Any of various suitable package pin structures, such as controlled collapse chip connection (C4) bumps or microbumps (as used in stacked silicon interconnect (SSI) applications), may be used to conduct electrical signals between a channel on an integrated circuit (IC) die (or other package device) and the circuit board on which the package is mounted.

SUMMARY

One example of the present disclosure is a semiconductor structure. The semiconductor structure generally includes a semiconductor layer, an adhesion layer disposed above the semiconductor layer, an anodic metal layer disposed above the adhesion layer, and a cathodic metal layer disposed above the anodic metal layer.

Another example of the present disclosure is a method of fabricating a semiconductor structure. The method generally includes disposing an adhesion layer above a semiconductor layer; disposing an anodic metal layer above the adhesion layer; and disposing a cathodic metal layer above the anodic metal layer.

Another example of the present disclosure is a method of fabricating an integrated circuit package. The method generally includes providing a semiconductor structure having an adhesion layer disposed above a semiconductor layer, an anodic metal layer disposed above the adhesion layer, and a cathodic metal layer disposed above the anodic metal layer; and bonding the cathodic layer of the semiconductor structure to a metallic layer of another structure at a temperature less than 200° C.

Yet another example of the present disclosure is an integrated circuit package. The package generally includes a package substrate and a plurality of dies disposed above the package substrate, wherein at least one of the plurality of dies is electrically coupled to another one of the plurality of dies via a plurality of copper pillar microbumps; the at least one of the plurality of dies comprises a cathodic metal layer forming the copper pillar microbumps, an anodic metal layer disposed above the cathodic metal layer, an adhesion layer disposed above the anodic metal layer, and a semiconductor layer disposed above the adhesion layer; and an oxidation potential of the anodic metal layer is greater than an oxidation potential of the cathodic metal layer.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DETAILED DESCRIPTION

Figure 1:
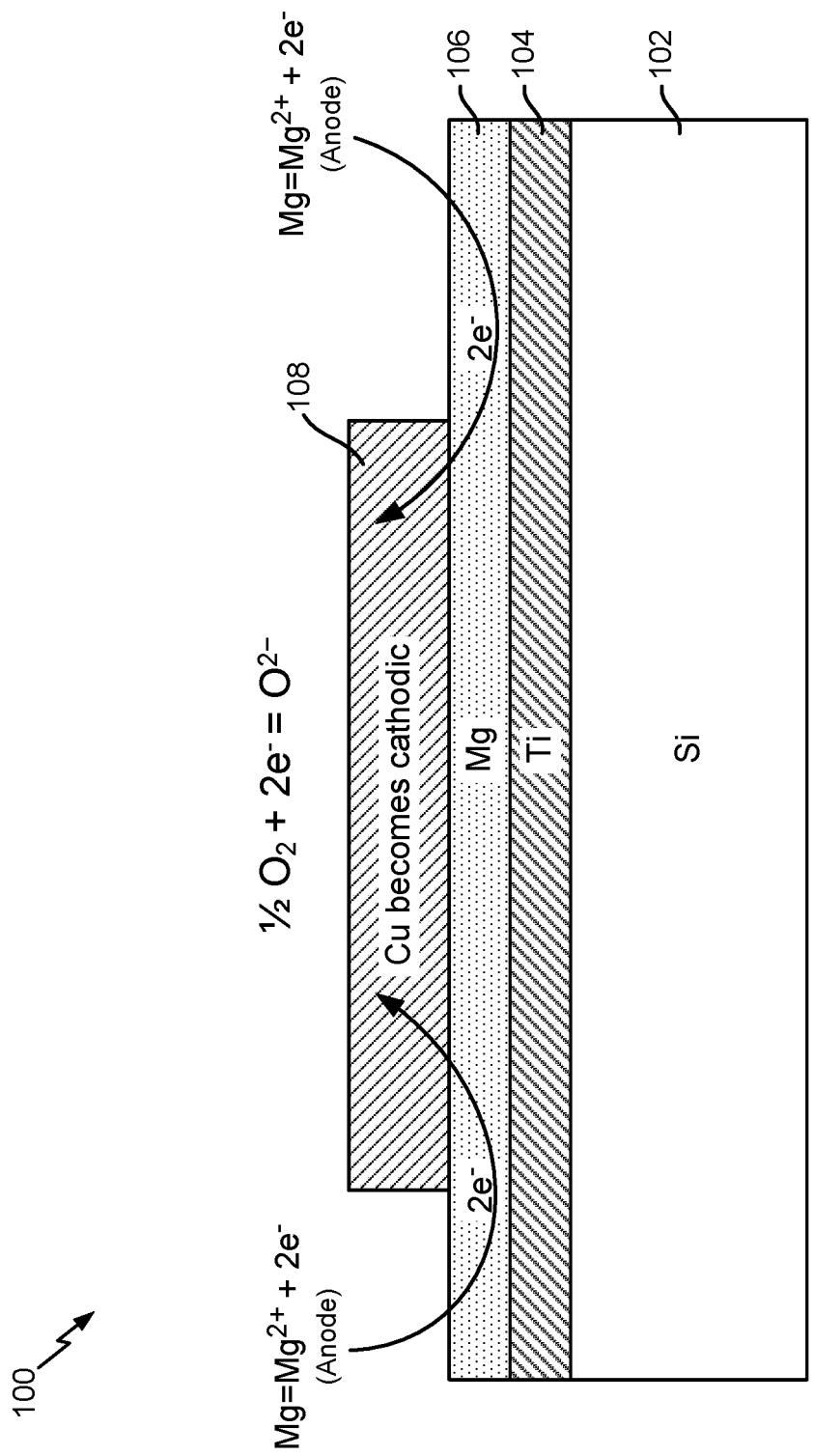
FIG. 1 is a cross-sectional view of an example semiconductor structure having an anodic metal layer in galvanic series with a cathodic metal layer, in accordance with an example of the present disclosure.

Examples of the present disclosure provide techniques and apparatus for Cu—Cu bonding with reduced concerns for oxide formation, thereby providing sufficient bonding at reduced temperatures (e.g., at most 200° C.) and faster cycle times, without any special requirements for this bonding. Examples of the present disclosure may also enable longer queue (Q) or staging times.

Example Cathodic Protection for Copper-to-Copper Bonding

Chip-to-chip (C2C), chip-to-wafer (C2W), and wafer-to-wafer (W2W) bonding technology relies on the interconnect technology being substantially robust to avoid connection failures when the chips and/or wafers are exposed to various stresses (e.g., temperature, strain, torsion, etc.). Copper (Cu) pillars with solder interconnects have been this industry's workhorse for low and high density designs for several decades. As densities continue to increase and pitch is reduced, however, this Cu pillar technology encounters various problems, such as reduced solder volume, brittle intermetallic compound (IMC), voiding, low thermal conductivity, and the like. Copper-to-copper (Cu—Cu) bonding is an alternative interconnect pursued by industry for several years, but to date, offers no real practical or high volume manufacturing (HVM) solution. One significant challenge to Cu—Cu bonding is rapid oxide formation on the Cu surface, which inhibits a satisfactory interconnect.

Currently, temperatures on the order of 400° C. are required to make a successful bond. Such high temperatures may melt certain materials (e.g., polymers), however. Universities, consortia, and industry have tried various methods for several years to enable lower temperature Cu—Cu bonding with limited success. For example, acid dip bonding, insertion bonding, self-assembled monolayers (SAM), and surface activation bonding (SAB) have all been attempted to address this long-felt need, but thus far have failed to produce an acceptable solution for HVM.

Examples of the present disclosure provide techniques for Cu—Cu metallic bonding at reduced temperatures (e.g., at most 200° C.) by significantly reducing Cu oxide formation. These techniques enable faster cycle time and entail no extraordinary measures (e.g., forming gas). Such techniques may also enable longer queue (Q) or staging times.

Deriving these techniques involved recognizing that different metals have different oxide formation behavior, since some metals may form passivating oxides, some form porous oxides, and others form very brittle oxides. The Pilling-Bedworth ratio ($R_{PB}$) represents an oxide-to-metal volume ratio. When $R_{PB}<1$, the oxide coating is broken, which offers no protective effect (e.g., magnesium (Mg): $R_{PB}=0.81$). When $R_{PB}>2$, the oxide coating chips off, also offering no protective effect (e.g., iron (Fe): $R_{PB}=2.1$). When $1 \leq R_{PB} \leq 2$, the oxide coating is passivating (e.g., aluminum (Al): $R_{PB}=1.28$ or titanium (Ti): $R_{PB}=1.73$). For Mg, the oxide is porous, so the oxidation rate expression is linear (e.g., W=K1t, where W is weight gain per unit area, K1 is a constant, and t is time. Metals with a non-porous oxide (e.g., Cu) can follow either parabolic or logarithmic behavior. For example, a parabolic oxidation rate may be expressed as W=K2t+K3 where K2 and K3 are time-independent constants at a given temperature. The oxidation rate of Al or Fe is logarithmic at near-ambient temperatures and may be expressed as W=K4 log (K5t+K6) where K4, K5, and K6 are constants.

Using the concepts above, a galvanic couple can be formed between Cu and certain other metals to inhibit Cu oxidation. An ideal case is a Cu/Mg couple as depicted in the example semiconductor structure 100 of FIG. 1. Mg forms a porous oxide and its oxide growth rate is linear. The Mg oxidation potential (2.37 V) is higher than that of Cu (−0.34 V), as illustrated in the table below:

TABLE 1

| Oxidation Reaction | Oxidation Potential |
|---|---|
| K → K$^+$ + e$^-$ | 2.93 |
| Ca → Ca$^{2+}$ + 2e$^-$ | 2.87 |
| Na → Na$^+$ + e$^-$ | 2.71 |
| Mg → Mg$^{2+}$ + 2e$^-$ | 2.37 |
| Al → Al$^{3+}$ + 3e$^-$ | 1.66 |
| Zn → Zn$^{2+}$ + 2e$^-$ | 0.76 |
| Pb → Pb$^{2+}$ + 2e$^-$ | 0.13 |
| Cu → Cu$^{2+}$ + 2e$^-$ | −0.34 |
| 2 I$^-$ → I$_2$ + 2e$^-$ | −0.54 |
| 2 Br$^-$ → Br$_2$ + 2e$^-$ | −1.07 |
| 2 Cl$^-$ → Cl$_2$ + 2e$^-$ | −1.36 |
| 2 F$^-$ → F$_2$ + 2e$^-$ | −2.87 |

Thus, Mg is very anodic in a galvanic series with Cu. Furthermore, the Gibbs free energy of oxide formation for Mg (−569.43 kJ/mol) is more negative than that of Cu (−127 kJ/mol). The integration of Cu and Mg in an interconnect will inhibit or at least reduce Cu oxide growth since Mg will sacrifice itself, thereby providing cathodic protection to Cu. Since Mg oxide is porous with a linear growth rate, Mg will continue losing electrons and form oxide with no Cu oxidation.

FIG. 1 is a cross-sectional view of an example semiconductor structure 100, in accordance with an example of the present disclosure. The semiconductor structure 100 may represent a wafer or an individual die (e.g., after singulation from a wafer). The semiconductor structure 100 comprises a wafer layer 102 (or substrate layer), an adhesion layer 104 disposed above the wafer layer 102, an anodic metal layer 106 disposed above the adhesion layer 104, and a cathodic metal layer 108 disposed above and in galvanic series with the anodic metal layer 106. The wafer layer 102 may comprise any suitable semiconductor material, such as silicon (Si). The adhesion layer 104 may comprise any of various suitable metallic materials (e.g., titanium (Ti), tantalum (Ta), or chromium (Cr)) that adhere well to the wafer layer 102. The cathodic metal layer 108 may comprise Cu, such that Cu—Cu bonding can form the interconnect between chips and/or wafers.

The anodic metal layer 106 may be composed of Mg as illustrated in FIG. 1. However, the anodic metal layer 106 may comprise any of various other suitable metals as an alternative to Mg. A suitable metal for the anodic metal layer 106 will have a higher oxidation potential than that of the cathodic metal layer 108, such that this metal is more anodic than Cu and thus provides cathodic protection when in galvanic series with Cu. For example, the anodic metal layer 106 may comprise Al, zinc (Zn), or nickel (Ni). However, some of these metals do not follow a linear oxide growth rate, so oxidation may become diffusion controlled over time, thereby limiting the electrons supplied to oxygen (O).

Figure 2:
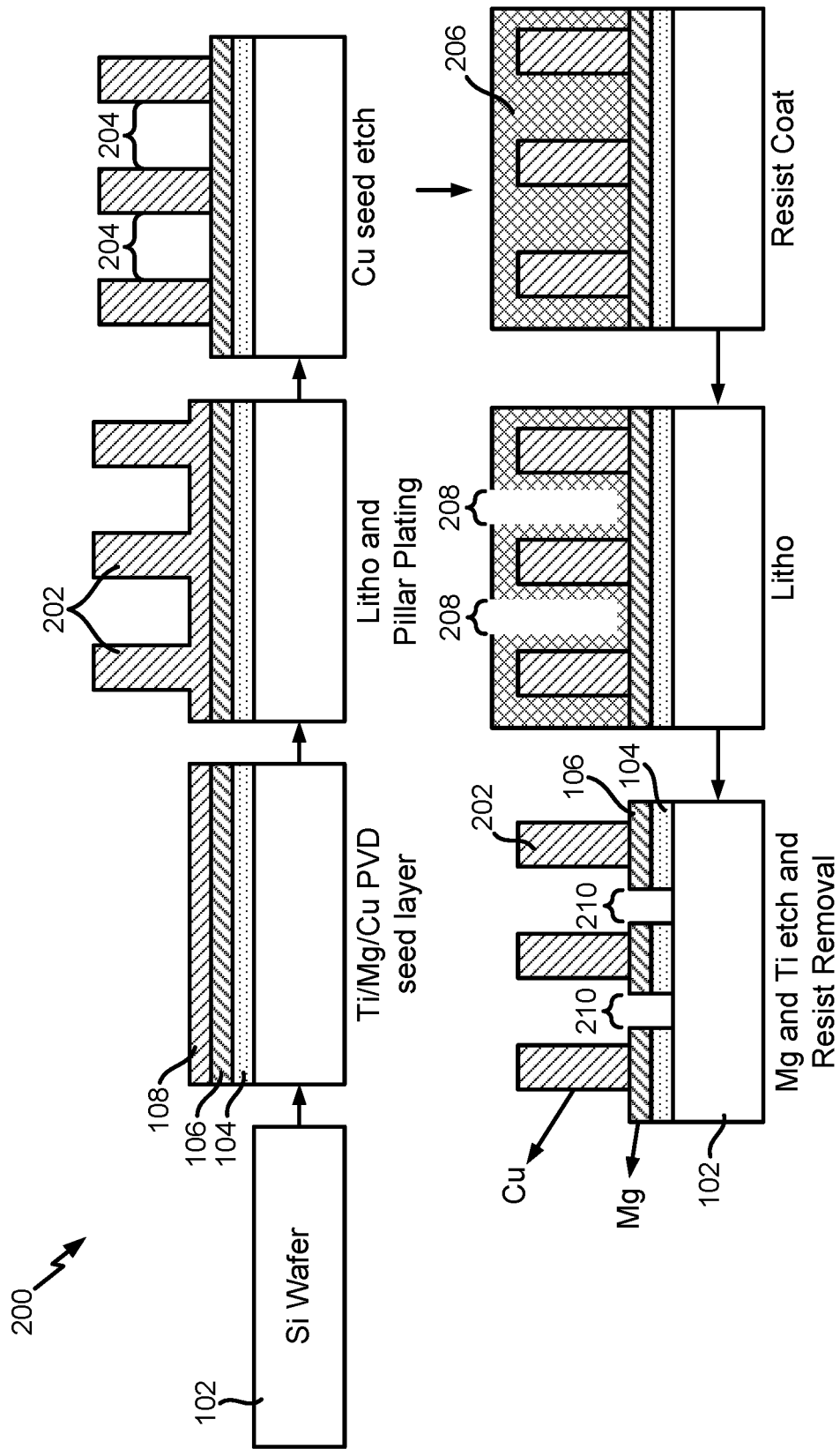
FIG. 2 illustrates example operations for forming copper pillars for copper-to-copper bonding based on the semiconductor structure of FIG. 1, in accordance with examples of the present disclosure.

FIG. 2 illustrates example operations 200 for forming copper pillars for Cu—Cu bonding based on the semiconductor structure 100 of FIG. 1, in accordance with examples of the present disclosure. The resulting structure from the operations 200 may be used for C2C, C2 W, or W2 W bonding at temperatures less than or equal to 200° C.

Beginning with a wafer layer 102 of Si or another suitable semiconductor layer, an adhesion layer 104, an anodic metal layer 106, and a cathodic metal layer 108 may be sequentially disposed above the wafer layer 102. Any of various suitable techniques (e.g., physical vapor deposition (PVD)) may be utilized for disposing the layers 104, 106, and 108 above the wafer layer 102 to form the semiconductor structure 100. Lithography and electroplating may be used to form multiple pillars 202 (e.g., copper (Cu) pillars) above the semiconductor structure 100 in designated areas, according to the lithography mask. In this manner, the cathodic metal layer 108 may be considered as comprising the pillars 202. Next, portions of the cathodic metal layer 108 may be removed (e.g., by etching) in areas 204 between the pillars 202. Thus, the cathodic metal layer 108 may be considered as a seed layer for plating the pillars in this process, where portions of the seed layer are subsequently removed and remaining portions of the seed layer form part of each pillar. After etching the seed layer in the areas 204, an upper surface of the structure may be coated with a resist 206. Lithography may be used to remove portions of the resist in desired areas 208 between the pillars 202. Then, portions of the anodic metal layer 106 (and in some cases the adhesion layer 104, as illustrated) may be removed using any of various suitable techniques (e.g., etching) in areas 210 between the pillars 202. The resist 206 may also be removed. The resulting structure in FIG. 2 is incapable of rapid copper oxide formation and is therefore suitable for Cu—Cu bonding with another structure (e.g., a chip or a wafer) to form a satisfactory interconnect at temperatures no more than 200° C.

For some examples, after or during formation of the pillars 202, sidewalls of an anodic metal (e.g., Mg) may be formed on lateral surfaces of the pillars and may surround the pillars. These anodic sidewalls may have the same height or a lower height than the pillars 202. These sidewalls may remain throughout the rest of the operations illustrated in FIG. 2.

Example Integrated Circuit Packages

An integrated circuit (IC) die (also referred to as a "chip") is typically disposed in a package for electrical connection with a circuit board (e.g., a printed circuit board (PCB)). The package protects the integrated circuit die from potential physical damage and moisture, which may lead to corrosion. Examples of the present disclosure may be utilized for chip-to-chip (C2C), chip-to-wafer (C2W), or wafer-to-wafer (W2W) bonding to form such IC packages. Cu-to-Cu bonding may be performed at temperatures lower than 200° C. to implement the C2C, C2W, or W2W integration, according to examples of the present disclosure.

Many different types of IC dies may benefit from examples of the present disclosure and be included in an IC package. One example type of IC die is a programmable IC die, such as a field programmable gate array (FPGA) die. An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC die is the complex programmable logic device (CPLD) die. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application-specific integrated circuits (ASICs).

As the demand for smaller electronic devices with increased capabilities rises, IC package technology has been expanding into more than just the traditional two-dimensional (2D) construction, leading to increased integration. The traditional 2D construction involves multiple IC dies disposed directly above a substrate (e.g., a system-in-package (SiP) substrate) and on the same plane. However, IC packages with 2.5D and 3D integration have been and are being further developed. Examples of 2.5D and 3D integration are provided below.

Figure 3:
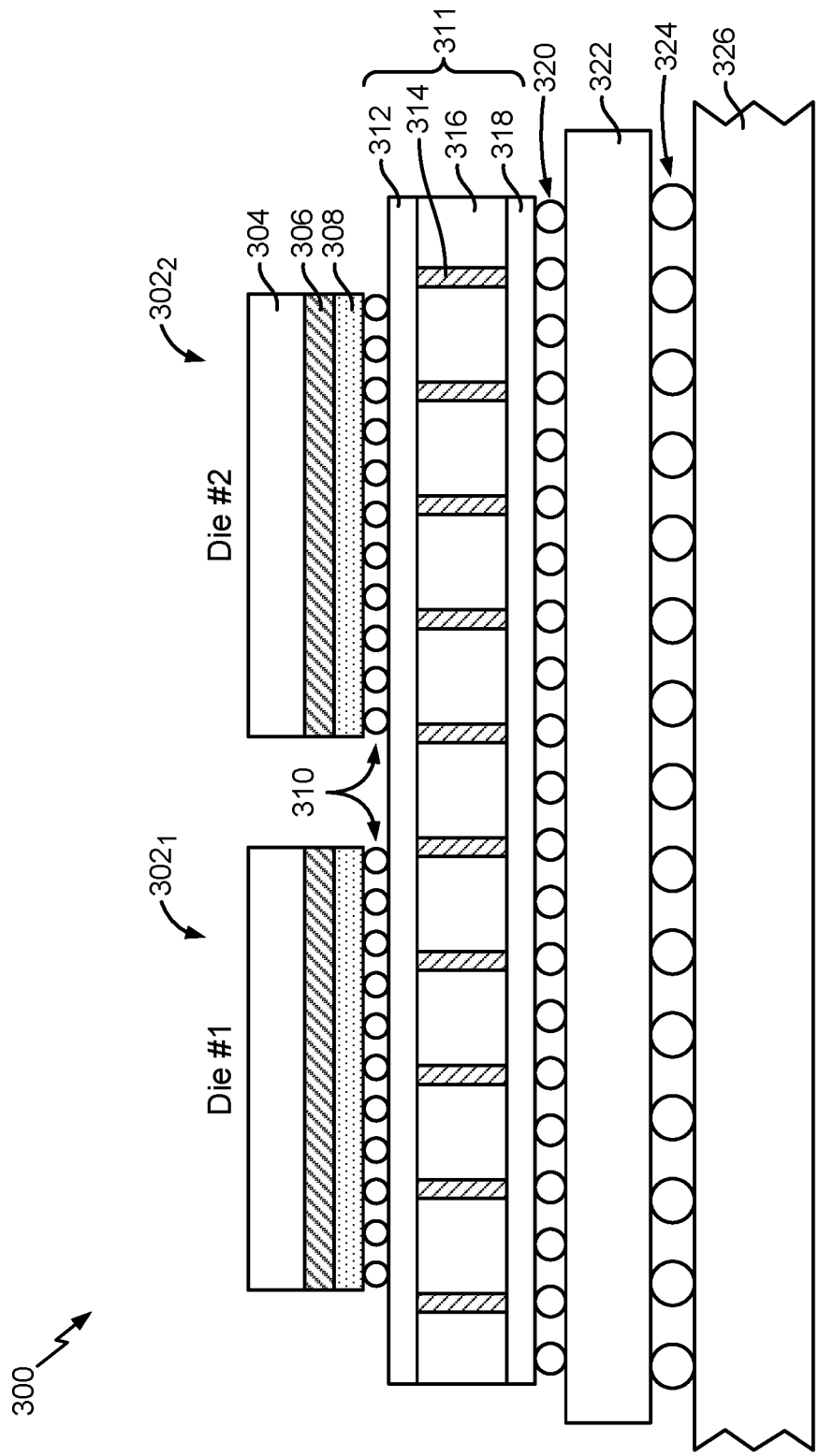
FIG. 3 is a cross-sectional view of an example 2.5D integrated circuit (IC) package, in accordance with an example of the present disclosure.

FIG. 3 is a cross-sectional view of an example 2.5D IC package 300 utilizing stacked silicon interconnect (SSI) technology, in accordance with an example of the present disclosure. The main difference between 2.5D and traditional 2D IC packages is the inclusion of an interposer with through-silicon vias (TSVs) on which the IC dies are disposed. For example, the IC package 300 includes a first die $302_1$ (labeled "Die #1") and a second die $302_2$ (labeled "Die #2") (collectively referred to as "dies 302"). The dies 302 may include any of various suitable dies, including highly manufacturable FPGA die slices, referred to as super logic regions (SLRs). Although only two dies 303 are shown in FIG. 3 for ease of illustrating the concept, it is to be understood that a 2.5D IC package may include more than two dies. Each die 302 may include a chip substrate 304, a device layer 306, and metal layers 308. The dies 302 may be flip-chip dies as illustrated, which are connected to an interposer 311 by microbumps 310. The microbumps 310 may be implemented as copper pillar microbumps (also referred to as copper pillar bumps, copper pillar μbumps, or copper pillars), which may be formed similarly to the pillars 202 of FIG. 2. The microbumps 310 permit finer pitch than conventional solder bumps. The interconnect formed between the dies 302 and the interposer 311 using the copper pillar microbumps is one example of Cu—Cu bonding with reduced oxide formation that may benefit from examples of the present disclosure.

SSI technology allows dies 302 of different types or silicon processes to be interconnected on the interposer 311. The interposer 311 acts as an interconnect vehicle on which the IC dies 302 are set side by side and interconnected. The interposer 311 may be a passive silicon interposer, for example. Although only one interposer 311 is illustrated in FIG. 3, an IC package may be implemented with multiple interposers for some examples. The interposer 311 may include an interposer substrate 316, a topside metal layers 312 disposed above the substrate 316, and bottom-side metal layers 318 disposed below the substrate 316. For some examples, the interposer 311 may also include a plurality of interconnect lines (not shown), which may provide high-bandwidth, low-latency connections through the interposer. The interposer 311 may also include TSVs 314 for routing connections between the dies 302 and a plurality of eutectic bumps 320 (e.g., controlled-collapse chip connection (C4) bumps) disposed between the interposer 311 and a package substrate 322. The TSVs 314 may provide the connections between the dies 302 and the package substrate 322 for the parallel and serial I/O, power/ground, clocking, configuration signals, and the like. The plurality of eutectic bumps 320 electrically connect the interposer 311 to the package substrate 322, and more particularly to conductive elements on the surface of and vias in the package substrate 322.

The IC package 300 also has a plurality of solder balls 324 disposed below the package substrate 322. The solder balls 324 may be arranged, for example, in an array of rows and columns for making electrical contact with a matching arrangement of conductive pads disposed on a surface of a circuit board 326 (e.g., a PCB).

Figure 4:
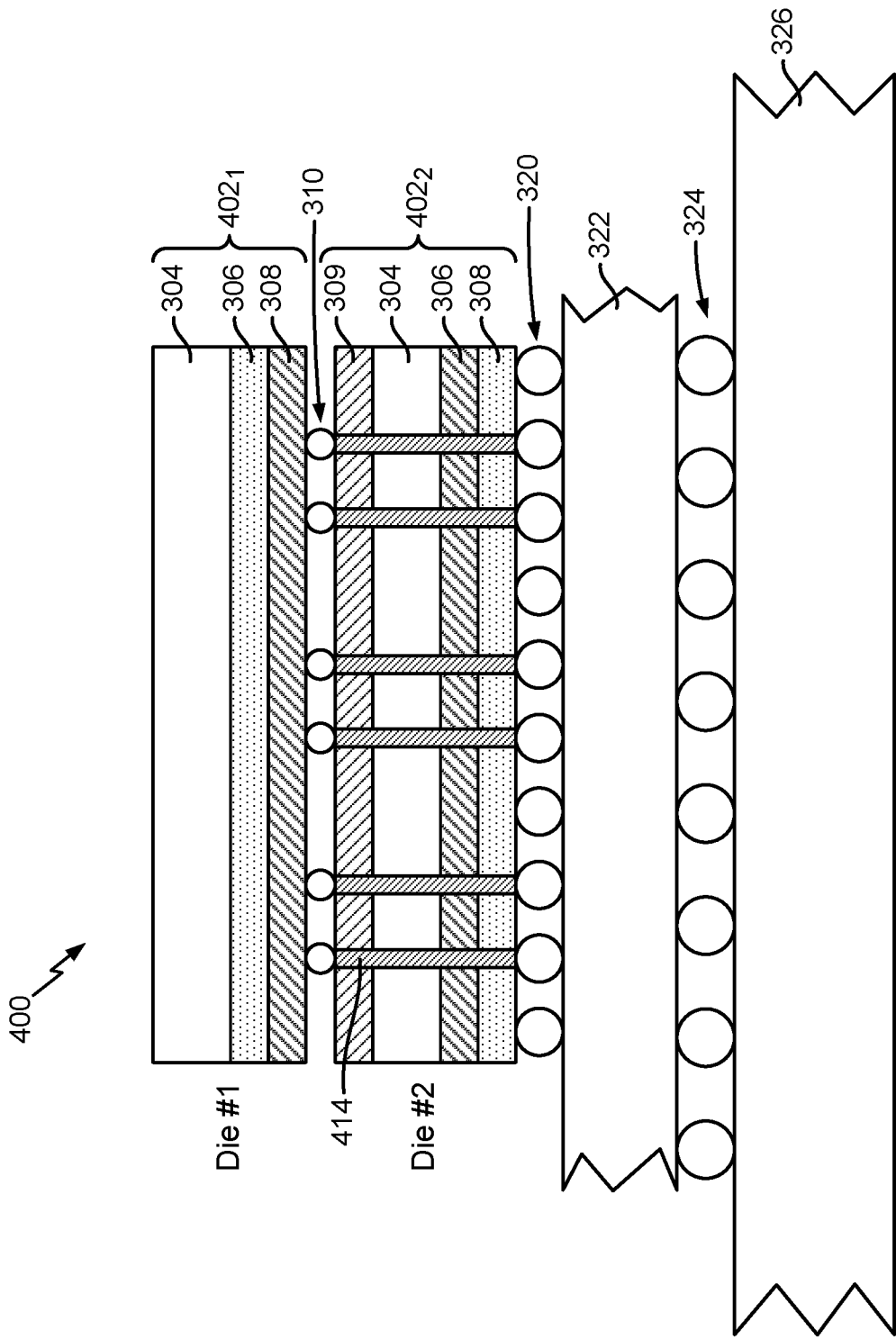
FIG. 4 is a cross-sectional view of an example 3D IC package, in accordance with an example of the present disclosure.

FIG. 4 is a cross-sectional view of an example 3D IC package 400, in accordance with an example of the present disclosure. A 3D IC package involves at least one IC die being stacked on top of another IC die (e.g., without an intervening component, such as an interposer or other passive die), where these active dies may be directly bonded to one another. The lower die(s) may employ TSVs to allow the upper die(s) to communicate with the lower die(s) and the package substrate. For example, the 3D IC package 400 involves a first die $402_1$ (labeled "Die #1") mounted above a second die $402_2$ (labeled "Die #2") (collectively referred to as "dies 402"). Although only two dies 402 are illustrated in FIG. 4, the reader will understand that more than two dies may be stacked. Furthermore, although the two dies 402 illustrated are the same size, it is to be understood that the dies may have different dimensions. For example, Die #2 may be wider than Die #1, and in this case, another die (not shown) may be disposed above Die #2, on the same plane as Die #1.

As illustrated in FIG. 4, Die #2 may include backside metal layers 309 disposed on the backside of the chip substrate 304 for connecting with the microbumps 310 such that Die #2 may be electrically connected to Die #1. Die #2 may also include TSVs 414 such that Die #1 may be electrically connected directly to the package substrate 322.

Example Operations for Fabricating a Package

Figure 5:
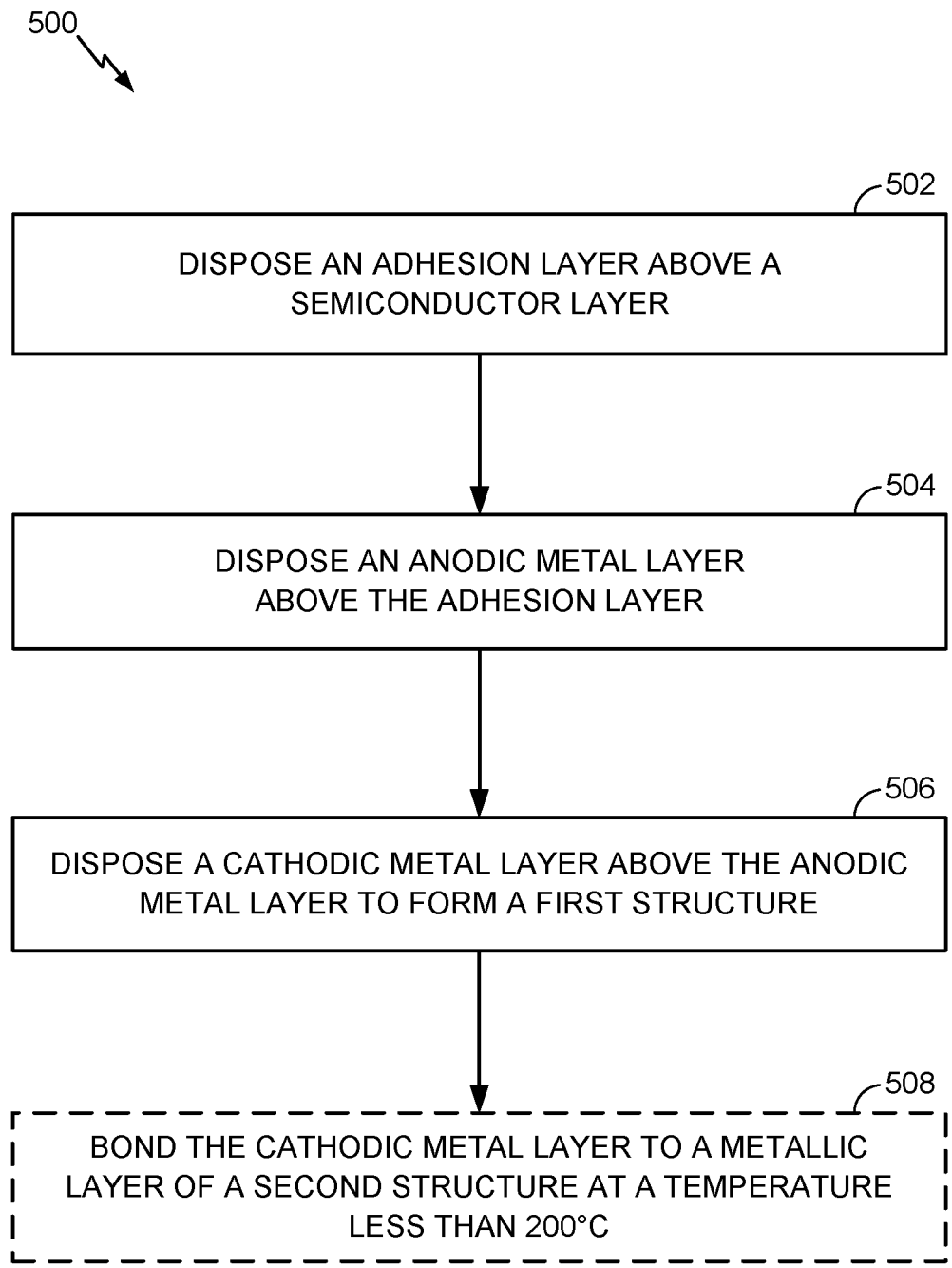
FIG. 5 is a flow diagram of example operations for fabricating a semiconductor structure, in accordance with an example of the present disclosure.

FIG. 5 is a flow diagram of example operations 500 for fabricating a semiconductor structure and/or a package (e.g., an IC package as described below) including the semiconductor structure, in accordance with an example of the present disclosure. At least a portion of the operations 500 may be performed, for example, by a system for fabricating the semiconductor structure, which may include a semiconductor processing chamber.

The operations 500 may begin, at block 502, by disposing an adhesion layer above a semiconductor layer. At block 504, an anodic metal layer may be disposed above the adhesion layer. At block 506, a cathodic metal layer may be disposed above the anodic metal layer.

According to some examples, at least one of disposing the adhesion layer at block 502, disposing the anodic metal layer at block 504, or disposing the cathodic metal layer involves using physical vapor deposition (PVD).

According to some examples, the operations 500 further entail using lithography and electroplating to form a plurality of pillars above the cathodic metal layer. The plurality of pillars may have the same composition as the cathodic metal layer. For some examples, the operations 500 further involve etching the cathodic metal layer to remove at least a portion of the cathodic layer between the plurality of pillars. For some examples, the operations 500 further include coating an upper surface of the semiconductor structure including the plurality of pillars with a resist. For some examples, the operations 500 further entail using lithography to remove at least a portion of the resist between the plurality of pillars, such that the anodic metal layer is exposed. For some examples, the operations 500 further involve etching at least a portion of the anodic layer and the adhesion layer between the plurality of pillars, such that the semiconductor layer is exposed and the resist is removed.

According to some examples, the anodic metal layer includes magnesium (Mg).

According to some examples, the anodic metal layer includes an element selected from the group consisting of aluminum (Al), zinc (Zn), and Nickel (Ni).

According to some examples, the cathodic metal layer includes copper (Cu).

According to some examples, an oxidation potential of the anodic metal layer is greater than an oxidation potential of the cathodic metal layer.

According to some examples, the anodic metal layer includes a metal associated with a porous oxide. In this case, an oxidation rate of the porous oxide may be linear as a function of time.

According to some examples, the anodic metal layer includes a metal having an oxide-to-metal volume ratio less than 1.0.

According to some examples, the anodic layer is configured to inhibit growth of an oxide associated with the cathodic metal layer by providing cathodic protection to the cathodic metal layer.

According to some examples, the operations 500 further include, at optional block 508, bonding the cathodic metal layer of the semiconductor structure to a metallic layer of another structure at a temperature less than 200° C.

Examples of the present disclosure provide an integration method for Cu—Cu bonding with reduced concerns for oxide formation, thereby providing sufficient bonding at reduced temperatures and faster cycle times, without any special requirements for this bonding. Examples of the present disclosure may also enable longer queue (Q) or staging times.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A method of fabricating a semiconductor structure, comprising:
    disposing an adhesion layer above a semiconductor layer;
    disposing an anodic metal layer above the adhesion layer;
    disposing a cathodic metal layer above the anodic metal layer;
    using lithography and electroplating to form a plurality of pillars above the cathodic metal layer, wherein the plurality of pillars have the same composition as the cathodic metal layer;
    etching the cathodic metal layer to remove at least a portion of the cathodic metal layer between the plurality of pillars;
    coating an upper surface of the semiconductor structure including the plurality of pillars with a resist;
    using lithography to remove at least a portion of the resist between the plurality of pillars such that the anodic metal layer is exposed; and
    etching at least a portion of the anodic metal layer and the adhesion layer between the plurality of pillars such that the semiconductor layer is exposed and the resist is removed.

2. The method of claim 1, wherein the anodic metal layer comprises magnesium (Mg) and wherein the cathodic metal layer comprises copper (Cu).

3. The method of claim 1, wherein an oxidation potential of the anodic metal layer is greater than an oxidation potential of the cathodic metal layer.

4. A method of fabricating an integrated circuit package comprising the method of claim 1 and further comprising bonding the cathodic metal layer of the semiconductor structure to a metallic layer of another structure at a temperature less than 200° C.

* * * * *